United States Patent
So et al.

[11] Patent Number: 5,831,446
[45] Date of Patent: Nov. 3, 1998

[54] PROCESS MONITOR TEST CHIP AND METHODOLOGY

[75] Inventors: Jason S. So, Carrollton; Tam T. Le, Garland; Milind Asnani, Dallas, all of Tex.

[73] Assignee: STMicroelectronics, Inc., Carrollton, Tex.

[21] Appl. No.: 679,138

[22] Filed: Jul. 12, 1996

[51] Int. Cl.$^6$ .................................................... G01R 31/28
[52] U.S. Cl. .............................. 324/763; 438/18; 257/48
[58] Field of Search .................................... 324/763, 765; 438/18; 257/48

[56] References Cited

U.S. PATENT DOCUMENTS

| | | | |
|---|---|---|---|
| 5,132,614 | 7/1992 | Sakumoto et al. | 324/763 |
| 5,457,400 | 10/1995 | Ahmad et al. | 324/763 |
| 5,500,603 | 3/1996 | Le | 324/751 |
| 5,563,524 | 10/1996 | Ungar | 324/765 |

Primary Examiner—Michael Brock
Attorney, Agent, or Firm—Theodore E. Galanthay; Lisa K. Jorgenson; Michelle Larson

[57] ABSTRACT

A process monitor test chip and methodology allows process-related manufacturing defects to be quickly identified and isolated. A basic circuit block of a test chip having a number of inverter cells serially connected with a corresponding number of observation points before the input of each inverter cell provides for the inverter cells in the basic circuit block to be probed and thus observed by e-beam technology. Any required number of basic circuit blocks may be serially connected end to end to constitute a chain circuit. Within the test chip itself, a plurality of chain circuits may be connected serially or in parallel to accomplish different testing goals. By controlling an input signal and a control signal of a multiplexing element associated with each chain circuit, the plurality of chain circuits can be forced into a serial connection or a parallel connection. In a serial mode, the plurality of chain circuits are serially connected with one input signal and one output signal of the test chip; the serial connection may be used during burn-in of the test chip to test for whether the test chip contains any process-related manufacturing defects. Once it has been determined that the test chip does contain process-related manufacturing defects, the parallel connection allows the defects of the test chip to be quickly isolated.

18 Claims, 4 Drawing Sheets

PROCESS MONITOR TEST CHIP AND METHODOLOGY

BACKGROUND OF THE INVENTION

The present invention relates generally to integrated circuit devices, and more specifically to the detection and isolation of process-related manufacturing defects of integrated circuit devices.

Process-related manufacturing defects may include interconnect problems with contacts and vias, conductor layer problems with the polysilicon and metal lines such as minimum metal width continuity and minimum metal spacing bridging, and insulator problems with the gate oxide and interlevel dielectric, all of which may cause low yield in a device. Process-related manufacturing defects may be caused by particle contamination and the process materials being used.

A problem with process-related manufacturing defects is that they are not easily detected before the integrated circuit devices are shipped to customers. Often, process-related manufacturing defects only come to the attention of the integrated circuit manufacturer when parts are returned from customers and subjected to failure analysis. There is thus an unmet need in the art to be able to isolate and identify process-related manufacturing defects in an integrated circuit device process in a timely and reliable manner before the devices are in the field.

SUMMARY OF THE INVENTION

It is an object of the present invention to quickly identify process-related manufacturing defects of an integrated circuit device.

It is further an object of the present invention to quickly isolate process-related manufacturing defects of an integrated circuit device.

Therefore, according to the present invention, a process monitor test chip and methodology allows process-related manufacturing defects to be quickly identified and isolated. A basic circuit block of a test chip having a number of inverter cells serially connected with a corresponding number of observation points before the input of each inverter cell provides for the inverter cells in the basic circuit block to be probed and thus observed by e-beam technology. Any required number of basic circuit blocks may be serially connected end to end to constitute a chain circuit. Within the test chip itself, a plurality of chain circuits may be connected serially or in parallel to accomplish different testing goals. By controlling an input signal and a control signal of a multiplexing element associated with each chain circuit, the plurality of chain circuits can be forced into a serial connection or a parallel connection. In a serial mode, the plurality of chain circuits are serially connected with one input signal and one output signal of the test chip; the serial connection may be used during burn-in of the test chip to test for whether the test chip contains any process-related manufacturing defects. Once it has been determined that the test chip does contain process-related manufacturing defects, the parallel connection allows the defects of the test chip to be quickly isolated.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

An advantage of the present invention is the capability to quickly detect and isolate process-related manufacturing defects in the gate oxide, stack and non-stack vias and contacts, and to ensure integrity of multiple level metal designs. A further advantage of the present invention is the capability of monitoring the process and performing easy systematic failure analysis of such process-related manufacturing defects. The process may be monitored with systematic detection and isolation of a variety of process defects, including gate oxide, individual non-stack vias and contacts, stack vias and contacts, minimum metal width continuity, and minimum metal spacing bridging.

Figure 1:
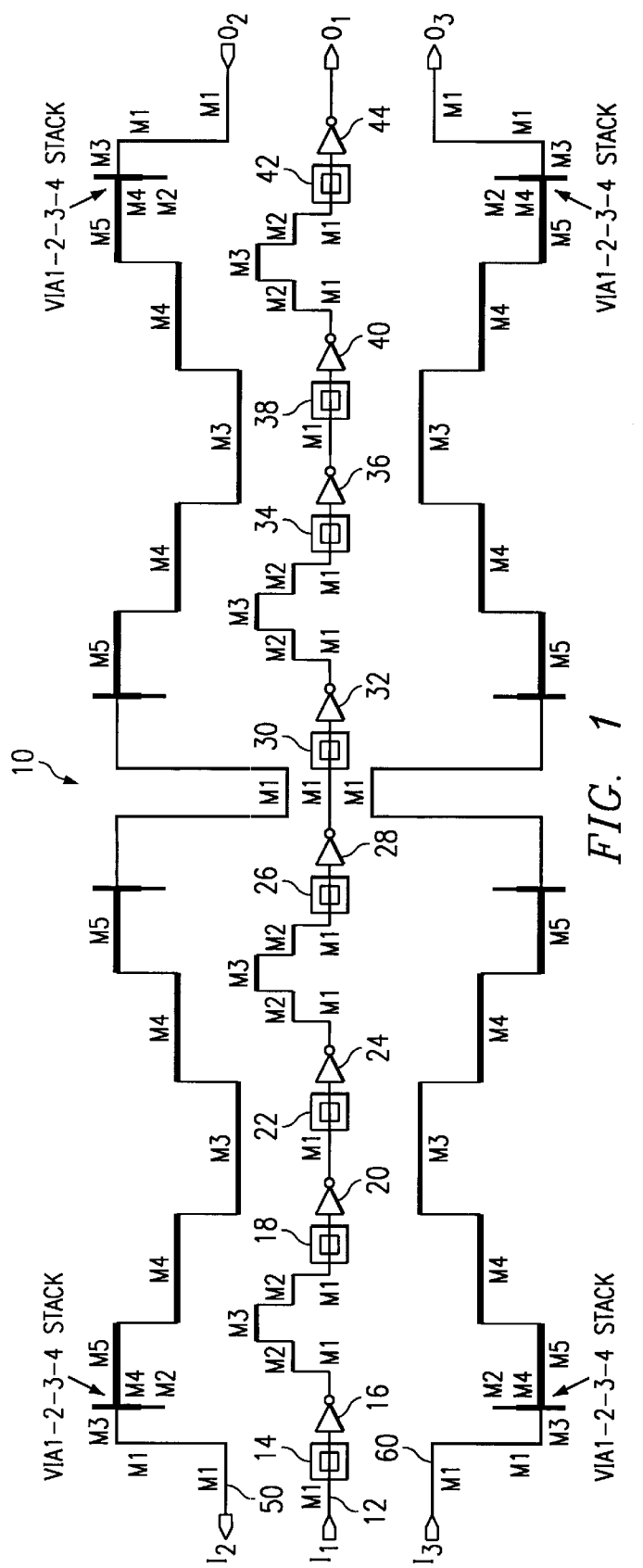
FIG. 1 is a multi-dimensional schematic of basic block circuitry, according to the present invention.

The capabilities of the present invention are made possible starting with the basic circuitry illustrated in the multi-dimensional schematic shown in FIG. 1. The multi-dimensional schematic of basic block 10 of FIG. 1 provides the basic circuit block of the present invention and includes eight inverter cells 16, 20, 24, 28, 32, 36, 40 and 44. Each inverter cell is constructed of a p-channel and n-channel transistor pair as is well known in the art. Thus, for each basic block 10, there will be a total of 16 p-channel transistors and 16 n-channel transistors. Pop-up observation points 14, 18, 22, 26, 30, 34, 38, and 42 at metal layer 4 (M4) provide observability and probing of the inverter cells through via 1-2-3 by e-beam.

Figure 2:
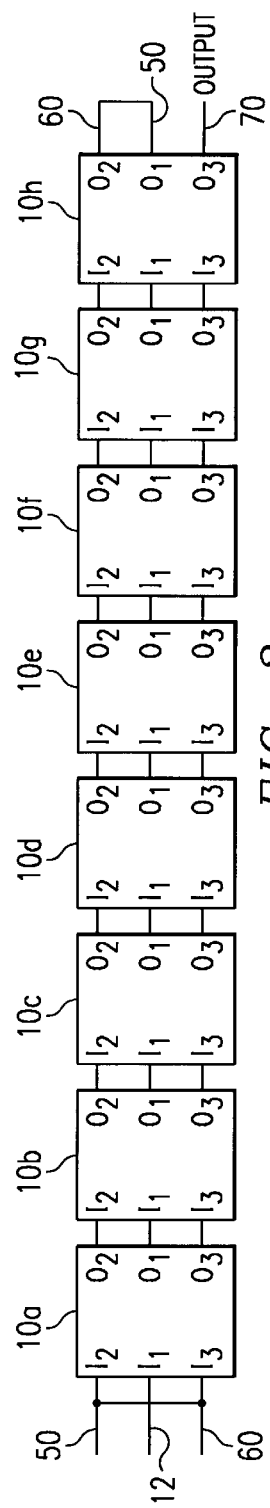
FIG. 2 is a block diagram of replication of the basic block circuitry of FIG. 1, according to the present invention.

Basic block 10 may be replicated the required number of times for a particular die size. For instance, for a die having 500,000 devices total, basic block 10 is replicated eight times, with each basic block 10 feeding the subsequent basic block 10 as shown in FIG. 2. Thus, Input signal 11 12 to the initial basic block 10 flows through a first path through a total of eight basic blocks 10a . . . 10h before being output as signal 50 from basic block 10h. Signal 50 is connected to signal 60 as shown in FIG. 2. Signal 60 propagates back through basic blocks 10h, 10g, 10f, . . . to basic block 10a where signal 50 connects to signal 60. Signal 60 loops back to the initial basic block 10a as input signal 60 of FIG. 1. Signal 60 through propagates through a third path of basic blocks 10a . . . 10h before being output at output signal 70. Output signal 70 then is the only output signal of the replication of eight basic blocks 10a . . . 10h as shown in FIG. 2. As can be seen from FIG. 1, the second path is simply a path through the different metal layers M1, M2, M3, M4 and M5 and contains no circuitry. Vias connecting metals layers M1, M2, M3 and M4 are shown. The second path is identical to the third path.

Referring again to FIG. 1, input signal 12 on the first metal layer M1 at the input of inverter 16 may be monitored and probed by an e-beam through an observation point 14, referred to as a "pop-up" 14. Pop-up 14, as well as other pop-up points 18, 22, 26, 30, 34, 38, and 42 is constructed of a stack of the via of layers 1, 2, and 3, referred to as via 1-2-3. The signal at the pop-up can be observed on the fourth metal layer M4 pad by e-beam if required. Signal 12 continues through inverter 16 and out onto M1. It then progresses through a first via, via1, to reach the second metal layer M2. After a short M2 run, signal 12 continues up to the third metal layer M3 through a second via, via2. The signal then goes back down to M1 in similar steps: first through via2, then M2, and finally through via1. Once the signal has returned to M1, there is another pop-up observation point 18 prior to the second inverter cell 20.

In this manner, signal 12 propagates through seven more inverter cells: 20, 24, 28, 32, 36, 40 and 44. Once signal 12 has propagated through inverter cell 44, output signal 01 becomes the input signal for the subsequent basic block 10b . . . 10h as shown in FIG. 2. If output signal O1 is the output signal of the last basic block 10h, it is referred to as signal 50 which is connected to signal 60 O2 of basic block 10h of FIG. 2. Signal 50 propagates through basic block 10 with minimum width and spacing in all locations in order to test continuity and bridging, respectively, of basic block 10. During the looping from the first path to the second path of basic block 10 through signal 50, and from the second path to the third path of basic block 10 through signal 60, the signal travels through M1 and jumps up the fifth metal layer M5 through stack vias 1-2-3-4 and then steps through one metal layer at a time until reaching the third metal layer M3. Upon propagation through all three paths of FIG. 2, the total spacing traversed could be, for instance, 4.90 m for M1, 3.11 m for M2, 1.73 m for M3, 2.30 m for M4, and 1.44 m for M5, and the total metal length traversed could be 20.6 m for M1, 3.8 m for M2, 2.9 m for M3, 5.2 m for M4 and 2.2 m for M5.

Figure 3A:
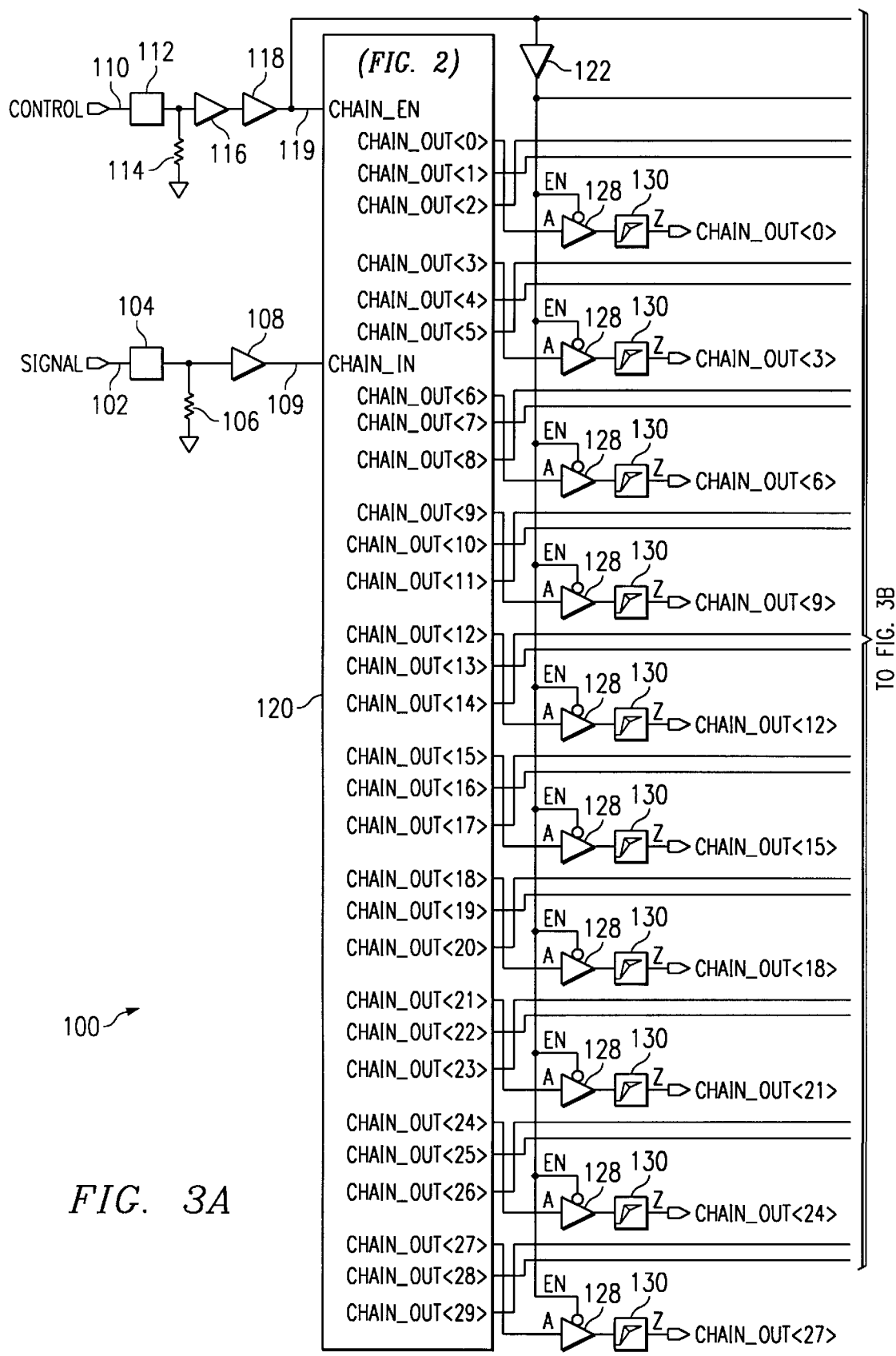
FIG. 3 is a test chip, according to the present invention.
Figure 3B:
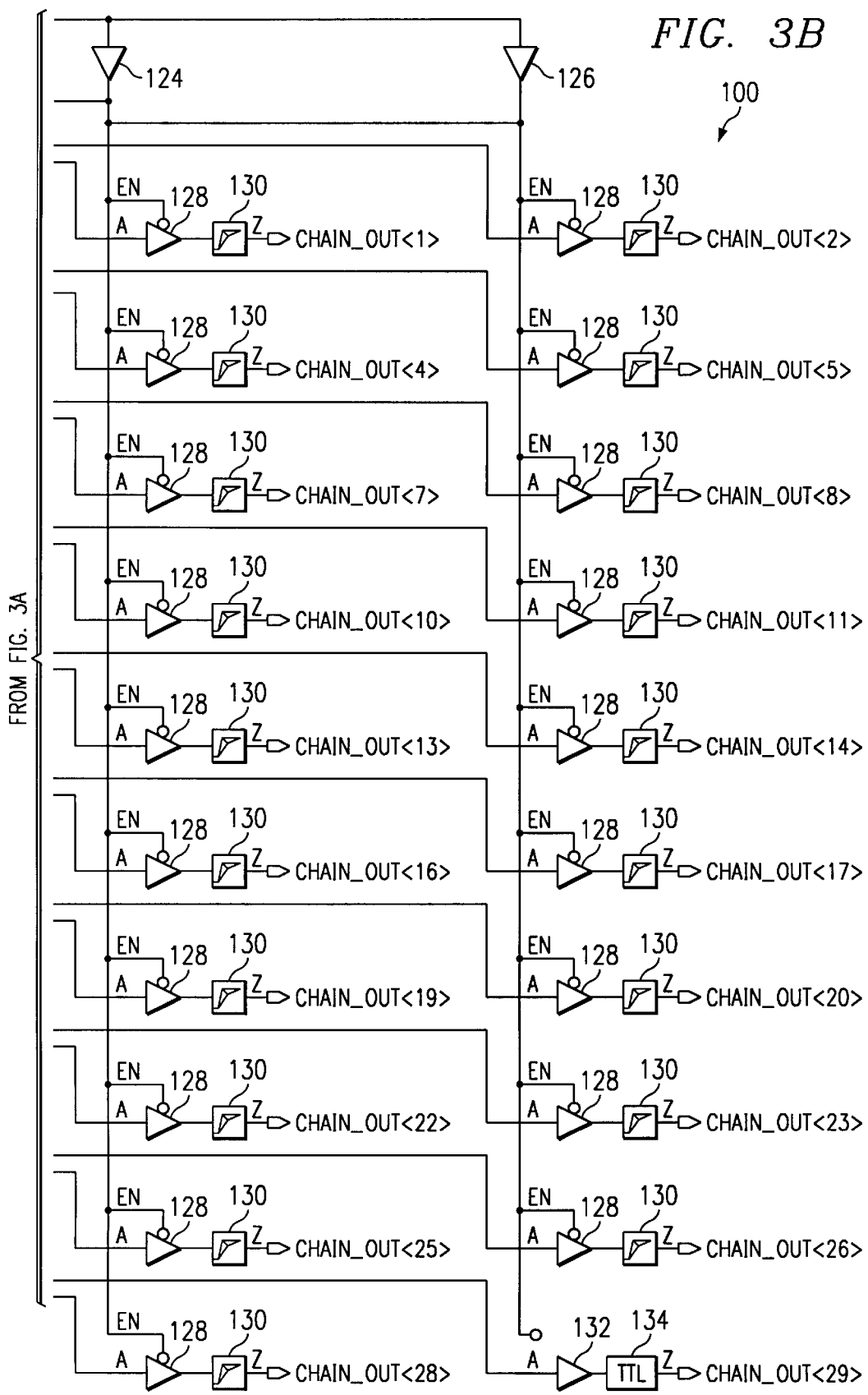

Referring to FIG. 3, the test chip of the present invention which utilizes the basic blocks 10 of FIGS. 1 and 2 is shown. Test chip 120 of test chip circuitry 100 has a single signal input, signal 102, a control input signal 110, and thirty output signals Chain_Out<0> . . . Chain_Out<29>. Typically control signal 110 is an Enable signal of the chip, but it may be any control signal desired. Output buffers 128, 132 and Output Pads 130, 134 correspond to output signals Chain_Out<0> . . . Chain_Out<29>, respectively. Output buffer 132 and Output pad 134 are associated with Chain_Out<29>. The circuitry inside test chip 120 is illustrated in FIG. 4.

Signal 102 may be probed on bond pad 104. Pull-down resistive element 106 ensures that signal 102 is normally a low logic level before passing through buffer element 108 to produce input signal 109 of test chip 120. Control signal 110, an enable signal for instance, may likewise be probed through bond pad 112. Pull-down resistor 114 ensures that control signal 110 is a low logic level before passing through buffer element 116 and then inverter element 118 to produce control input signal 119 of test chip 120.

Figure 4:
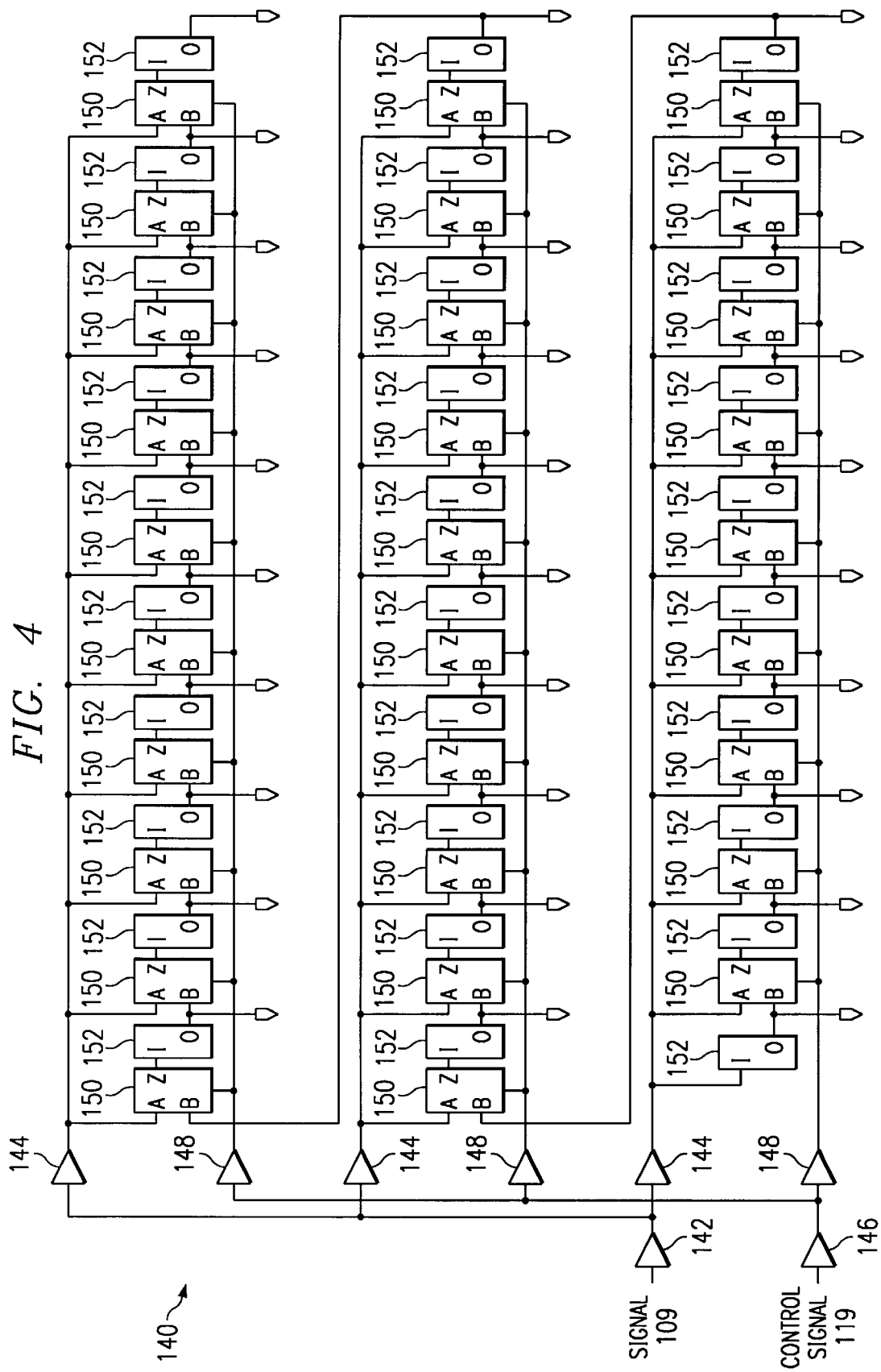
FIG. 4 is the circuitry inside the test chip of FIG. 3, according to the present invention.

Referring to FIG. 4, the circuitry 140 inside test chip 120 is illustrated. Internal to test chip 120, thirty chains which comprise chain circuitry 152 Chain0 . . . Chain29 analogous to replication of the basic block circuitry 10 of FIG. 1 and multiplexing elements 150 MUXO . . . MUX29 as shown. It should be noted that there is no multiplexing element associated with the initial chain circuitry 152 Chain0. Assuming a chip that has 500,000 elements, each chain is composed of 1920 of the above described basic block 10 of FIG. 1. Signal 109 passes through buffer elements 142 and 144 before being supplied as a first input signal to multiplexing elements 150 MUX0 . . . MUX29. Control signal 119 passes through buffer elements 146 and 148 before being supplied to multiplexing elements 150 MUX0 . . . MUX29. Control signal 119 is a buffered signal that is normally a high logic level and is connected to pull-down element 114 of FIG. 3. Signal 109 is normally a low logic level that is connected to pull-down element 106 of FIG. 3.

The thirty chains shown in FIG. 4 may be configured in either a serial or a parallel fashion, as a function of the values of the first and second input signals supplied to multiplexing elements 150. The first input signal of multiplexing elements 150, denoted as input "A", is provided by signal 109, while the second input signal of multiplexing elements 150, denoted as input "B", is provided by the output signal of the preceding chain circuitry 152. Control signal 119 controls the "S" input of multiplexing elements 150. In the case of chain circuitry 152 Chain0, there is no multiplexing element 150 required. When it is desired to test the circuitry of test chip 120, the "B" input signal of multiplexing elements 150 is an active signal and all thirty chains of FIG. 4 are connected together serially in one long chain in a serial mode. In this serial connection, the only output signal of test chip 120 will be output signal Chain_Out<29>. Such is the case during burn-in of the test chip, when testing for any errors caused by process-related defects occurs.

In case of functional failures of any of the thirty chains, it is possible to systematically review by use of the pop-up observation points illustrated in FIG. 1. If errors are detected during testing of the test chip, the thirty chains may be connected in parallel to one another simply by changing the value of the third input signal being provided to input S of multiplexing elements 150 in a parallel mode. When signal 119, then, transitions from a high logic level signal to a low logic level signal then each of the thirty chains are in parallel with one another and a signal is generated as the output signal of each chain circuitry 152. There will thus be thirty output signals Chain_Out<0> . . . Chain_Out<29>, one for each chain circuitry 152.

The output signals Chain_Out<0> . . . Chain_Out<29> may be monitored as illustrated in FIG. 3. The first 29 output signals Chain_Out<0> . . . Chain_Out<28> connect to output buffers 128 which may be tristated as a function control signal 119. Control signal 119 is provided to output buffers 128 via buffers 122, 124 and 126. Output buffers 128 may be monitored on output pads 130. Output signal Chain_Out<29> is provided to output buffer 132. Output buffer 132 is not tri-stated since it is the only output signal of test chip 120 in a serial mode. Output buffer 132 is connected to output pad 134 as shown.

The parallel connection of the thirty chain circuits allows the source of the error to be pinpointed to one or more chain circuits. The exact location of the error can then be quickly identified by making use of the pop-up observation points illustrated in FIG. 1 along the failed chain. Localized failure analysis can then determine the exact cause of the failure.

The present invention allows process shifts to be monitored and process-related manufacturing defects to be tracks so that yields on products manufactured under the process may be continuously improved. It is envisioned that the test chip of the present invention may be fabricated along with other products on the manufacturing line. The test chip will be tested in testers, such as the J971 tester, to detect any failures. Any failures detected can be quickly isolated due to the unique construction of the test chip. The test chip can thus provide early warning of process shifts and yields problems associated with a particular process.

While the invention has been particularly shown and described with reference to a preferred embodiment, it will be understood by those skilled in the art that various changes in form and detail may be made therein without departing from the spirit and scope of the invention.

What is claimed is:

1. A test chip structure to quickly identify and locate a functional failure of a test chip, comprising:
   an input signal of the test chip structure;
   a plurality of inverter cells connected serially, with the input signal supplied to an initial inverter cell of the plurality of inverter cells;
   a plurality of observation points, with each observation point of the plurality of observation points corresponding to an associated inverter cell of the plurality of inverter cells and located at an input of the associated inverter cell, which may be probed in order to observe the input signal at the associated inverter cell;
   a plurality of metal layers of the test chip, wherein the plurality of metal layers have a minimum width and spacing;
   a plurality of vias connecting a portion of the plurality of metal layers of the test chip; and
   an output signal of a final inverter cell of the plurality of inverter cells which propagates along the plurality of metal layers of the test chip and which may be probed through the plurality of vias.

2. The test chip structure of claim 1, wherein each inverter cell of the plurality of inverter cells is comprised a p-channel transistor and an n-channel transistor.

3. The test chip structure of claim 1, wherein the input signal may be probed at each observation point of the plurality of observation points by an e-beam.

4. A test chip structure to quickly identify and locate a functional failure of a test chip, comprising:
   a test chip, having an input signal and a control input signal; and
   a plurality of chains, located within the test chip, with each chain of the plurality of chains, with the exception of an initial chain of the plurality of chains, comprising:
      a multiplexing element having an output signal of a preceding chain as a first input, the input signal of the test chip as a second input, the control input signal of the test chip as a third input and generating an output signal; and
      a chain circuit having the output signal of a preceding multiplexing element as an input and generating an output signal;
      wherein the initial chain of the plurality of chains only comprises the chain circuit having the input signal as an input and does not comprise the multiplexing element;
   wherein when the third input of each multiplexing element of the plurality of multiplexing elements is a first logic level, then the plurality of chains are configured serially in a serial mode and when the third input of each multiplexing element is a second logic level, then the plurality of chains are configured in parallel in a parallel mode.

5. The test chip structure of claim 1, wherein in the serial mode, the test chip has the output signal of the chain circuit of a terminal chain of the plurality of chains as an only output signal.

6. The test chip structure of claim 1, wherein in the parallel mode, the test chip has a plurality of output signals defined as the output signal of each chain circuit of the plurality of chain circuits.

7. The test chip structure of claim 6, wherein the location of the process-related manufacturing defect may be determined by an observation point located in a chain circuit of the plurality of chain circuits having the process-related manufacturing defect.

8. The test chip structure of claim 1, wherein a chain circuit of each chain of the plurality of chains, comprises:
   a plurality of inverter cells connected serially, with the input signal supplied to an initial inverter cell of the plurality of inverter cells;
   a plurality of observation points, with each observation point of the plurality of observation points corresponding to an associated inverter cell of the plurality of inverter cells and located at an input of the associated inverter cell, which may be probed in order to observe the input signal at the associated inverter cell;
   a plurality of metal layers of the test chip, wherein the plurality of metal layers have a minimum width and spacing;
   a plurality of vias connecting a portion of the plurality of metal layers of the test chip; and
   an output signal of a final inverter cell of the plurality of inverter cells which propagates along the plurality of metal layers of the test chip and which may be probed through the plurality of vias.

9. The test chip structure of claim 8, wherein each inverter cell of the plurality of inverter cells is comprised a p-channel transistor and an n-channel transistor.

10. The test chip structure of claim 8, wherein the input signal may be probed at each observation point of the plurality of observation points by an e-beam.

11. The test chip structure of claim 1, wherein the output signal of the chain circuit of each chain of the plurality of chains being connected to an output buffer.

12. The test chip structure of claim 11, wherein the output buffer connected to the output signal of the chain circuit of each chain of the plurality of chains, with the exception of the output signal of the chain circuit of a terminal chain of the plurality of chains, is tri-stated.

13. The test chip structure of claim 11, wherein the output buffer connected to the output signal of the chain circuit of each chain of the plurality of chains is connected to an output pad.

14. The test chip structure of claim 1, wherein the input signal of the test chip is connected to a first pull-down element and the control input signal of the test chip is connected to a second pull-down element, wherein the first pull-down element and the second pull-down element are connected to a reference voltage.

15. The test chip structure of claim 14, wherein the first pull-down element and the second pull-down element are each a pull-down resistor.

16. A method for quickly identifying and locating a functional failure of a test chip, comprising the steps of:
   entering a serial mode of a test chip in which a plurality of chains of the test chip are arranged serially when a first input signal of each multiplexing element of a plurality of multiplexing elements of the test chip is active causing the plurality of chains of the test chip to be serially arranged;
   testing the test chip while in the serial mode to determine if the test chip contains a process-related manufacturing defect;
   entering a parallel mode in which the plurality of chains are arranged in parallel when a second input signal of the multiplexing element and an input signal of an initial chain of a plurality of chains is active causing the plurality of chains of the test chip to be arranged in parallel, if testing the test chip in the serial mode determined that the test chip does contain a process-related manufacturing defect; and probing an observation point of a chain circuit having the process-related manufacturing defect of a plurality of chain circuits of the test chip in the parallel mode to locate the process-related manufacturing defect of the test chip.

17. The method of claim 16, wherein in the serial mode, the test chip has an output signal of a chain circuit of a terminal chain of the plurality of chains as an only output signal.

18. The method of claim 16, wherein in the parallel mode, the test chip has a plurality of output signals defined as an output signal of each chain circuit of the plurality of chain circuits of the test chip.

* * * * *